United States Patent [19]

Keever et al.

[11] 4,213,090
[45] Jul. 15, 1980

[54] INTEGRAL FLUX LAGGING AND LIGHT LOAD ADJUSTMENT ASSEMBLY FOR WATTHOUR METERS

[75] Inventors: Joseph M. Keever; George W. Lipscomb, both of Raleigh, N.C.

[73] Assignee: Westinghouse Electric Corp., Pittsburgh, Pa.

[21] Appl. No.: 954,383

[22] Filed: Oct. 25, 1978

[51] Int. Cl.² .......................................... G01R 11/02
[52] U.S. Cl. ...................................................... 324/138
[58] Field of Search ................................. 324/137, 138

[56] References Cited
U.S. PATENT DOCUMENTS

| 2,057,443 | 10/1936 | Mylius et al. | 324/138 |
| 2,352,965 | 7/1944 | Mendelsohn | 324/138 |
| 2,879,476 | 3/1959 | Hallbauer | 324/138 |
| 2,947,942 | 8/1960 | Morong | 324/137 |
| 3,493,862 | 2/1970 | Ramseg et al. | 324/137 |
| 3,790,888 | 2/1974 | Morong | 324/138 |
| 3,796,954 | 3/1974 | McQuarrie | 324/138 |

Primary Examiner—Michael J. Tokar
Attorney, Agent, or Firm—R. W. Smith

[57] ABSTRACT

A voltage magnetic section of a watthour meter includes a voltage flux lagging loop formed integrally with a platform part directly attached to the voltage magnetic core. Light load adjustment members are movably mounted on the platform which also carries a manual operator for shifting the light load members to a predetermined position for proper operation in the meter.

8 Claims, 4 Drawing Figures

INTEGRAL FLUX LAGGING AND LIGHT LOAD ADJUSTMENT ASSEMBLY FOR WATTHOUR METERS

BACKGROUND OF THE INVENTION

1. Field of the Invention

This invention relates to induction watthour meters including an electromagnet assembly and more particularly to such meters having an integral magnetic flux lagging and light load adjustment assembly for calibrating and compensating line voltage responsive fluxes generated in the electromagnet assemblies thereof.

2. Description of the Prior Art

Induction watthour meters are almost universally used for billing and load monitoring of AC electric energy transmitted by an electric utility company or other electric energy supplier to residential and commercial electricity users. Voltage and current magnetic sections of the meter electromagnet assembly produce line voltage and line current responsive magnetic fluxes into an electroconductive disc so it is rotated in response to the consumption of AC electric energy. In manufacture and design of watthour meter electromagnet assemblies, it is known to provide adjustments on the voltage magnetic section so that the voltage and current fluxes rotate the disc at a calibrated rate or speed having a predetermined ratio to the measured electric energy usage in kilowatt hours. The ratio of the disc speed to the measured electric energy is often referred to as the watthour constant of the meter.

Correction and adjustment of the power factor or voltage flux phase lag and light load characteristics are two common calibrating adjustments of induction watthour meters. The calibrations are used to provide operation in accordance with the well-known basic theory of operation of induction watthour meters which includes the principle that the magnetic flux from the voltage section, being responsive to the line voltage, must lag the magnetic flux from the current section, being responsive to the line current, by ninety electrical degrees when the line voltage and current are in phase at unity power factor. In modern watthour meters, the voltage and current fluxes are directed in the quadrature phase relationship in opposing directions into an air gap space and into opposite sides of the meter disc in the gap. The fluxes produce eddy currents in localized areas of the disc. In accordance with the aforementioned basic theory, interaction of the eddy currents with the voltage and current magnetic fluxes develops torque on the meter disc in proportion to the measured electrical energy. A coil having a large number of small conductor winding turns is typically mounted on the center leg of an E-shaped magnetic core of the voltage section. This voltage coil has substantial inductance so that the voltage air gap flux produced by the coil will substantially lag the line voltage but not by ninety degrees without further adjustment. To provide the additional flux lagging adjustment, it is known to provide a loop of conductive material around the voltage flux so that circulating current is induced therein to establish a further voltage flux component that is vectorially added to the voltage coil main flux component to produce a corrected working voltage flux in the disc air gap space. The resultant air gap voltage flux has substantially the aforementioned ninety degrees or quadrature lagging relationship with the line voltage and the current flux at unity power factor. It is further important that the calibrated values provided by the adjustments be maintained during mechanical shocks and vibrations occurring during shipping and handling of the meters.

One example of a voltage conductive lag loop is disclosed in U.S. Pat. No. 2,879,476. A second electroconductive loop forms a light load adjustment element. Both the lag loop and the light load loop members are movably mounted on a separate bracket attached to the side of the magnetic core of the meter electromagnet. In U.S. Pat. No. 2,057,443, a rectangular plate with a center hole surrounds the voltage magnetic pole to provide the ninety degree voltage flux lag or quadrature relationship with the current flux. One or two laminations of the core are bent to prevent shifting of the lagging quadrature plate. A separately-supported vernier lag adjuster plate is moved at right angles to the direction of disc torque by a worm gear adjusting element mounted on one side of the quadrature plate. A torque adjuster plate is also provided for multi-element meter electromagnets. In U.S. Pat. No. 2,352,965, a lag coil is made of a conductive material and is provided with an adjustable lag plate part for varying the resistance. A magnetic strap is clamped to the adjustable lag plate so that a small percentage of the voltage main pole flux is diverted and lagged and may be shifted for light load adjustment so that the disc torque can be shifted in either direction.

Light load adjustment differs from the phase lag adjustment so that at low values of line current an unsymmetrical component of voltage flux will add torque to the meter disc. A part of the light load adjustment compensates for the slight frictional drag on the meter disc shaft and another part compensates for the non-linear and lower permeability characteristics of the laminated magnetic core materials at low magnetic induction causing the line current related flux to be disproportionately low. Compensation and calibration of the light load adjustment in some electromagnet assemblies, and in the present invention, is related to the regulation of the disc torque producing magnetic drive effects of a secondary voltage flux path established between the meter disc and a pair of auxiliary voltage pole faces. The secondary voltage flux path is divided and extends between the disc and the pair of auxiliary voltage poles formed at the free ends of the outside legs of an E-shaped voltage core on opposite sides of the main voltage pole face. The secondary flux path produces secondary torques on the disc in opposite directions. A light load adjuster is described in U.S. Pat. No. 2,947,942 which includes two magnetic members movable over the auxiliary pole faces. The magnetic members produce dissymmetry in the disc torque producing effects of the secondary flux path in a predetermined aiding relationship to the main driving torque on the disc. The magnetic members are movably mounted on a brass bracket fastened to the meter electromagnet assembly and the bracket also carries a threaded adjusting member to move the magnetic members. In U.S. Pat. No. 3,493,862, assigned to the assignee of this invention, a light load adjuster is described including soft magnetic members carried by a nonmagnetic bracket. The magnetic members are pivotally mounted on the bracket so that the ends of the members extend over the faces of the voltage flux arms to vary light load calibrations.

The aforementioned prior art voltage section adjustment arrangements do not provide voltage flux lagging loop adjustment member formed integrally with a bracket attached to the voltage magnetic core to add strength and rigid spacing of the core outer legs while providing a mounting platform for a light load adjustment member having two magnetic members movable across the voltage auxiliary pole faces to provide a predetermined light load disc torque adjustment nor provide an integral assembly having a lag loop tightly secured in place so as to prevent changes in calibration when subjected to shock.

SUMMARY OF THE INVENTION

In accordance with the present invention, a voltage magnetic section of an induction watthour meter electromagnet includes an integral flux lagging and light load adjustment assembly formed by a one piece electroconductive bracket having a platform area for supporting two movable light load adjusting magnetic members and further having a lag loop portion extending integrally from the side of the platform so as to encircle the working voltage flux. Integral mounting tabs of the bracket are secured to the outer legs of the magnetic core of the voltage section for attaching the bracket so as to correctly position the lag loop and light load members.

The bracket maintains rigid separation of the free ends of the outer core legs, which define flux return poles, from the center leg, which defines the main pole of the voltage core. The outer legs are maintained at predetermined magnetic spacings from the center leg to precisely control the component of voltage flux passing therebetween. The light load magnetic members are mounted against the bottom of the rigid bracket platform so as to be movable in a horizontal plane substantially parallel to the lag loop with movement thereof being in the direction of the disc torque. The lag loop is interference fitted on the edges of the main pole face in one preferred form. A manual operator is threadably mounted on top of the platform to adjust the light load magnetic members so that the adjustment assembly is strong, compact, simply and easily manufactured, and provides multi-functional voltage magnetic section adjustments. These and other advantages and features of the present invention will be apparent from the detailed description of the invention illustrated in the drawings briefly described hereinafter.

DESCRIPTION OF THE PREFERRED EMBODIMENT

Figure 1:
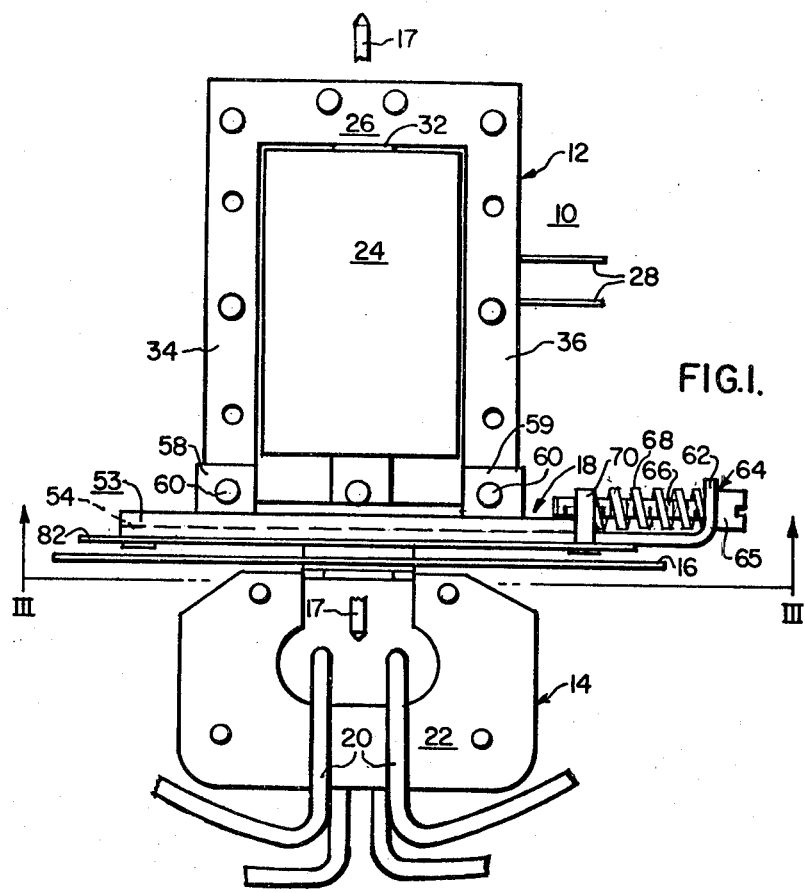
FIG. 1 is a front elevational view of an electromagnet assembly of an induction watthour meter including the integral flux lagging and light load adjustment assembly made in accordance with the present invention.

Referring now to the drawings and more particularly to FIG. 1, there is shown an induction watthour meter 10 for measuring electric energy transmitted from an electric energy supplier to a customer thereof for load monitoring and billing purposes. A single stator electromagnet assembly of the meter 10 includes a voltage magnetic section 12 and a current magnetic section 14 carried by a frame part not shown. An electroconductive disc 16 is carried by a shaft 17, partially shown, for rotation in a predetermined air gap space between the voltage and current magnetic sections 12 and 14. An integral magnetic flux lagging and light load adjustment assembly 18 forming an important feature of the present invention is included in the voltage magnetic section 12 as described in particular detail hereinbelow.

In the current magnetic section 14, large diameter conductors are formed into current coils 20 mounted around a current laminated magnetic core 22. The current coils 20 are connectable in a conventional manner in series with an AC line current component of the electric energy quantity to be measured. In the voltage section 12, a voltage coil 24 is formed by a large number of winding turns of a small diameter wire and is mounted on a voltage magnetic laminated core 26. A pair of coil terminals 28 of the coil 24 are connectable in a conventional manner in parallel with an AC line voltage component of the electric energy quantity to be measured.

The voltage magnetic core 26 has an E-shaped configuration with the center leg 32 receiving the coil 24 and defining the main pole of the voltage section 12. The outer legs 34 and 36 of the core 26 define flux return poles. The center leg 32 terminates at an expanded area defining a main pole face 38 shown in FIGS. 3 and 4 and the outer legs 34 and 36 terminate at auxiliary pole faces 40 and 42, respectively, also shown in FIG. 3.

When the voltage coil 24 and the current coils 20 are properly energized from the AC line voltage and current components of the AC electric energy to be measured, the magnetic flux of the coil 24 is generated in the center leg 32 and the coil fluxes of the coils 20 are generated in the C-shaped core 22. A working voltage flux component of the flux of the coil 24 flows from the main pole face 38 and working current flux components of the coils 20 flow from the pole faces of the core 22 so that the working voltage and current fluxes pass into the air gap therebetween and into the disc 16. These working or air gap voltage and current fluxes produce eddy currents therein which develop a resultant torque acting to drive the disc 16 relative to the stationary electromagnet assembly. The torque on the disc 16 produces a rate of rotation or speed that is dependent upon the product of the AC line voltage and current components and the phase angle therebetween and, therefore, the AC electric energy. The rotation of the disc 16 may be employed in any suitable manner for indicating the measured electric energy such as by a dial register, not shown, drivingly connected to a rotating shaft supporting the disc 16.

To produce the proper flux phase quadrature relationships so that the working voltage magnetic flux lags the working current magnetic flux and to produce a light load calibration, voltage flux adjustment elements are provided on the voltage magnetic section 12 by the adjustment assembly 18 of this invention. The magnetic flux of the voltage coil 24 has several paths in which each is carefully controlled to provide proper operation of the meter 10. In order to adjust the phase relationship between the working voltage magnetic flux and the AC line voltage applied to the coil 24, a primary flux lagging or phase adjustment is made by the integral adjustment assembly 18 of this invention and is described more fully hereinbelow. A vernier and variable flux lagging adjustment is provided by a flux leakage path established through a soft magnetic bracket 44, shown in FIGS. 2 and 3. The center of the bracket 44 receives a soft magnetic screw 46 partially extending into the center leg 32 of the voltage core 26. The screw 46 has a portion thereof surrounded by an electroconductive cylinder, not shown, to effect a closed secondary winding in accordance with the operation of the variable phase adjustment elements as described in U.S. Pat. No. 3,212,005 and 3,493,862, both assigned to the assignee of this invention. A soft magnetic tongue 52 extends from the center of the bracket 44, around the edge of the disc 16 to be disposed between the pole faces of the current core 22 to provide a highly efficient working voltage flux return path as also described in the last name U.S. Pat. No. 3,493,862. The light load adjusting elements are combined with the primary phase or flux lagging elements in the integral adjustment assembly 18 of this invention as described more fully hereinafter.

Figure 2:
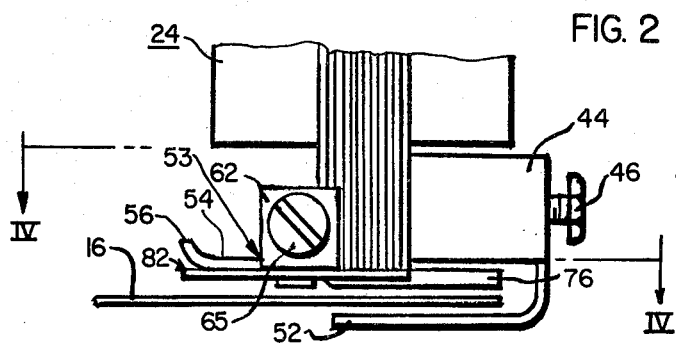
FIG. 2 is an end view of the assembly shown in FIG. 1.
Figure 3:
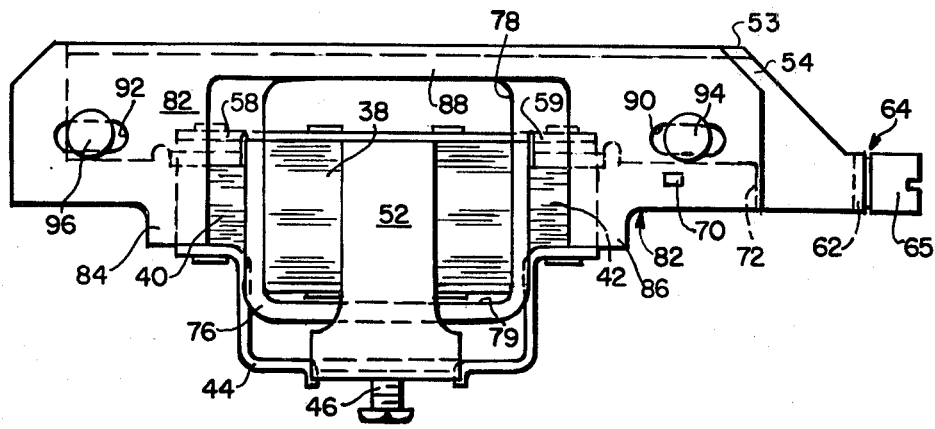
FIG. 3 is a cross-sectional view taken along the axis III—III in FIG. 1 and looking in the direction of the arrows.
Figure 4:
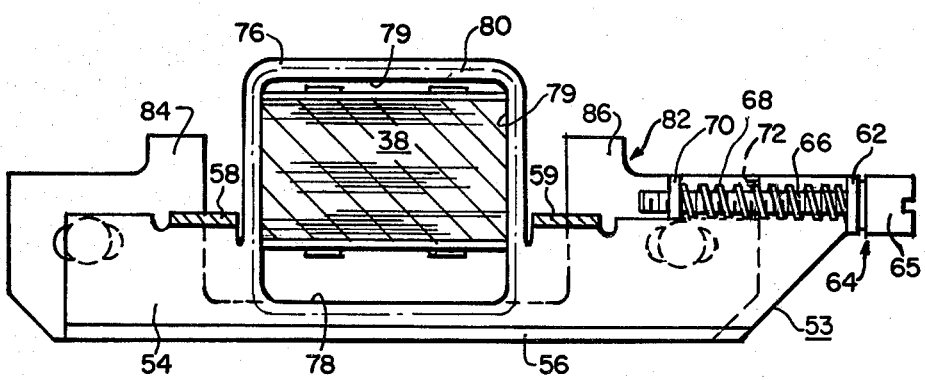
FIG. 4 is a cross-sectional view of FIG. 1 taken along the axis IV—IV and looking in the direction of the arrows.

The integral magnetic flux lagging and light load adjustment assembly 18 is best shown in the various views of FIGS. 2 through 4. The assembly 18 includes a bracket portion 53 made of a relatively strong electroconductive material such as sheet aluminum having a thickness in the order of 0.060 inch (0.15 cm). The bracket 53 includes a rigid flat platform 54 having a top configuration as shown in FIG. 4. The outer side edge of the platform 54 is turned up at right angles to form a rib 56 providing further strength and rigidity of the bracket. The edge opposite the outer rib 56 includes two upturned mounting tabs 58 and 59 for attachment to the outer voltage core legs 34 and 36 as shown in FIG. 1. Rivets 60 secure the tabs 58 and 59 as well as the aforementioned ends of the bracket 44 to the outer legs 34 and 36.

At the right hand end of the platform 54 as viewed in FIGS. 1 and 4, a bent extension of the platform 54 forms a support tab 62 for a manually rotatable operator 64. The operator 64 is journalled for rotation in a center hole of the tab 62. The operator 64 is formed by a screw type adjusting member having a head 65 and a shank 66 terminated by a threaded end. A stiff coil spring 68 forming a rotation restrainer is mounted over the shank 66 between the tab 62 and an internally threaded member 70 described more fully hereinabove in connection with the light load adjusting portion of the assembly 18. The member 70 is linearly movable within a cut-out space defined on three sides by an elongated recess or notch 72 extending into the platform outer side edge opposite the end of the rib 56.

As shown in FIGS. 3 and 4, a continuous conductive lag loop portion of the bracket is formed by an inverted U-shaped extension 76, as viewed in FIGS. 3 and 4, extending from the inner side edge of the platform 54 adjacent the tabs 58 and 59 so as to encircle the main voltage pole face 38. A flat U-shaped edge 78 defines a generally rectangular recess extending into the center of the inner edge of the platform 54 so as to define a continuation of the inner edge 79 of the extension 76. Thus, the conductive material of the bracket 53 and continuous extension 76 completely encircles the working voltage flux eminating from the main pole face 38. The outer edge rib 56 is important in strengthening the platform 54 in the area thereof including the narrow platform section between the edge 78 and the edge rib 56.

A continuous current conductive path, indicated by the broken line 80 in FIG. 4, is formed by the three-sided extension 76 and the area of the platform 54 adjacent the edge 78 thereof. The continuous current path or loop 80 defines a single turn secondary winding inductively coupled to the magnetic fluxes from the pole face 38. Thus, the circulating current in the path 80 produces a flux component which is vectorily added to the coil main flux to substantially achieve the quadrature flux lagging relationship of the working voltage flux relative to the current flux at unity power factor.

The inverted U-shaped and three-sided extension 76 is downwardly offset at a bent portion thereof at the junction of the extension opposite legs or sides adjacent the tabs 58 and 59 where the extension 76 is connected to the platform 54. The offset is more clearly shown in FIG. 2. The opposite side edges of the pole face 38 are clampingly engaged by the interference fitting facing portions of the opposite portions of extension edge 79 as shown in FIGS. 3 and 4. The main pole 38 extends slightly below the auxiliary pole faces 40 and 42 by an amount substantially equal to the thickness of the U-shaped extension. Thus, the bottom surface of the platform 54 extends in a plane substantially parallel to the auxiliary pole faces 40 and 42 and parallel and above the extension 76.

The engagement of all of the edges of the laminations of the main pole face 38 by the extension edge 79 substantially increases the support thereof. Correspondingly, the extension 76 is locked in place so that no changes in the flux calibrations occur when the meter is subjected to shock. The integral mounting tabs 58 and 59 provide strong support of the core outer legs 34 and 36. The gap spaces between the leg 40 and the adjacent end of the main voltage pole including the pole face 38 and between the outer legs 42 and the adjacent end of the voltage main pole are known as voltage flux control gaps. These control gaps must be maintained at constant predetermined distances for proper control of flux passing directly between the main and return poles. The opposite legs of the inverted U-shaped extension 76, which engage the ends of the main voltage pole adjacent the pole face 38, also extend over the flux control gaps between the ends of the main pole above the pole face 38 and the outer flux return poles immediately above the auxiliary pole faces 40 and 42. The extension 76 does not affect the control gap voltage flux components since it does not encircle these as it does the working voltage flux component. Although the magnetic bracket 44 is also fastened between the ends of the legs 34 and 36, it is made of a soft magnetic material such as cold rolled steel and does not have the substantial structural strength as does the bracket 53 including the platform 54 and associated integral parts thereof. In some modern meters, a bracket corresponding to the bracket 44 is even made flexible to accommodate variations in the width of the main pole face. Accordingly, the platform 54 being attached by the tabs 58 and 59 to the outer legs 34 and 36 provides a major and strong support of the outer legs. The engagement of the inverted U-shaped extension 76 of the platform 54 with the sides of the main pole defining the pole face 38 provides further and interconnected strong support for the three pole face ends of the E-shaped voltage core 26.

As noted above, the effects of the magnetic flux lag loop feature of the conductive path 80 formed by the extension 76 and a portion of the bracket platform 54 produces an additional phase lag of the working voltage flux and brings it within close quadrature phase lagging relationship to the AC line voltage and the current flux at unity power factor. The inductance of the voltage coil 24 provides a phase lag in the order of eighty to eighty-five degrees of flux phase displacement as noted hereinabove. The quadrature or flux lag loop produces an additional phase lag of the working voltage flux to approximately or substantially ninety degrees. The width and size of the extension 76 determines the current carrying characteristics of the lag loop path 80 so that the compensating voltage flux component can effect the desired quadrature or slightly greater flux lag at unity power factor. If required the vernier and adjustable phase adjuster screw 46 produces the exact ninety degrees phase lag and the desired flux phase quadrature relationship in the working voltage flux.

Referring now to the light load adjustment feature of the assembly 18, a magnetic plate 82, formed of a soft or high permeable magnetic material such as cold rolled steel, is movably mounted to the bottom of the platform 54 as described hereinafter. The plate 82 includes two magnetic members 84 and 86 extending over predetermined areas of the auxiliary pole faces 40 and 42 as shown in FIG. 3. A bridging section 88 interconnects the magnetic members 84 and 86. The opposite ends of the plate 82 provide a mounting area surrounding the mutually aligned elongated slots 90 and 92. Rivets 94 and 96 extend through the slots 90 and 92, respectively, for slidably mounting and retaining the plate 82 to the bottom of the platform 54. The head portions of the rivets 94 and 96 extend beyond the edges of the slots 90 and 92, respectively, for providing a slidable relationship with the bottom of the platform 54. The threaded member 70, referred to hereinabove is fixedly mounted on top of the plate 82 for receiving the threaded end of the shank 66 of the operator 64. Accordingly, the threading and unthreading rotations of the operator 64 shift the magnetic members 84 and 86 across the auxiliary pole faces 40 and 42. The stiff coil spring 68 biases the thread end of shank 66 against the internal threads of member 70. It is to be noted that the offset of the inverted U-shaped extension 76 positions it in a common plane with the magnetic members 84 and 86.

The movement by the manual operator 64 causes the magnetic members 84 and 86 to cover more of one of the auxiliary pole faces 40 and 42 as it uncovers more of the other auxiliary pole face. A similar light load adjusting operation is described in the aforementioned U.S. Pat. No. 2,947,942. The magnetic members 84 and 86 vary the part of the voltage flux which flows in a divided secondary flux path extending from opposite sides of the air gap path of the working voltage flux. The secondary flux flows into the disc 16 on opposite sides of the area directly beneath the main pole face 38 where the working voltage flux flows into the disc 16. The secondary voltage flux path extends from the disc to each of the auxiliary voltage pole faces 40 and 42 so that two eddy current paths, similar to those described in the last-named patent, are established. The two auxiliary eddy current paths are additive on one side and subtractive on the other in producing torque on the disc. The magnetic members 84 and 86 are adjusted so that the net effect of the auxiliary eddy currents is to produce an adding or driving torque on the disc to compensate for the aforementioned non-linearities of the magnetic characteristics of the laminated core materials and mechanical retarding forces which may be produced by the bearing mountings of the disc support shaft 17. The magnetic members 84 and 86 effectively vary the reluctance and air gap spacing in the aforementioned divided portions of the secondary voltage flux between the disc and the auxiliary pole faces 40 and 42.

It is contemplated that one modification of the assembly 18 may be made to the lag loop part formed by the extension 76 by making it adjustable such as having removable cut-out portions to vary its resistance as described in the aforementioned U.S. Pat. No. 2,352,965.

The integral magnetic flux lagging and light load adjustment assembly 18, as described hereinabove, provides a compact and unique assemblage of elements adding strength and rigidity to the voltage core 26 without requiring a separate bracket member. The platform 54 provides a base for supporting the light load magnetic members 84 and 86 and is attached by its integral mounting tabs 58 and 59 to the voltage core outer legs 34 and 36. The inverted U-shaped extension 76 of the platform 54 forms a lag loop integrally including a portion of the platform 54. The engagement of the internal edge 79 of the extension 76 with the main pole provides still further rigidity and fixed pole spacings to the voltage core 26. The fixed and rigid connections prevents variations in the control gap spacings between the main pole and flux return poles that would change the meter calibrations when it is subjected to shocks and vibrations in shipping and handling. Similarly, the calibrated working voltage flux phase adjustment of the loop path 80 is fixedly maintained by the rigid mounting of the extension 76 to withstand shock and vibrations. The whole interconnection of the assembly 18 with the core 26 forms a more integrated construction of the voltage magnetic section 12 while the assembly 18 further uniquely provides the phase quadrature voltage flux lagging adjustment and movable support of the light load adjustment in accordance with the present invention.

It is contemplated that modifications and changes to the preferred embodiment as described hereinabove will be apparent to those skilled in the art without departing from the spirit and scope of our invention.

We claim:

1. An induction watthour meter including an electromagnet assembly with voltage and current magnetic sections and a rotatable disc driven at a rate responsive to voltage and current magnetic fluxes directed from the magnetic sections into said disc, wherein said voltage magnetic section comprises:

a voltage magnetic core including a main pole terminating at a main pole face and two adjacent flux return poles terminating at coplanar auxiliary pole faces on opposite sides of said main pole face;

a one piece electroconductive bracket and lag loop member having a platform carrying two mounting tabs at one side thereof fixedly attached to said flux return poles, said one piece member further having a continuous current conducting loop portion including an inverted U-shaped extension projecting from said one side of said platform and around said main pole face for producing a predetermined phase lagging effect in a working voltage magnetic flux component directed from said main pole face and into said disc;

magnetic means extending over said auxiliary pole faces in substantially coplanar relationship with said inverted U-shaped extension and being slidably mounted on a bottom surface of said platform, said magnetic means being movable within a secondary voltage magnetic flux component extending between said disc and said coplanar auxiliary pole faces for varying the increasing and decreasing disc torque producing effects of the secondary voltage flux component; and manual operator means mounted on the top surface of said platform and being connected to said magnetic means for varying a light load adjustment position of said magnetic means.

2. An induction watthour meter as claimed in claim 1 wherein said voltage magnetic core includes a main pole face extending outwardly from said main pole and toward said flux return poles so as to be spaced laterally from the flux return poles by predetermined control gap spacings and further wherein said main pole face extends below the coplanar auxiliary pole faces, and wherein the inner edges of opposite side leg portions of said inverted U-shaped section clampingly engage the lengths of opposite side edges of said main pole face.

3. An induction watthour meter as claimed in claim 2 wherein said opposite side leg portions of said inverted U-shaped section are offset from the plane of said platform and extend over the control gap spacings to the inner portions of both of said auxiliary pole faces.

4. An induction watthour meter as claimed in claim 1 wherein said platform includes an integral upstanding tab supporting one end of said manual operator for rotation therein.

5. An induction watthour meter as claimed in claim 4 wherein said manual operator means includes an externally threaded end and an internally threaded member fixedly attached to said magnetic means and threadably receiving said threaded end of said manual operator, and further wherein said platform includes an elongated notch in the side opposite said one side through which said internally threaded member extends.

6. An induction watthour meter as claimed in claim 3 wherein said magnetic means includes a plate of soft magnetic material having first and second magnetic members extending over said coplanar auxiliary pole faces and being interconnected by a bridging portion of the soft magnetic plate.

7. An induction watthour meter as claimed in claim 6 wherein said plate of soft magnetic material includes opposite end portions each including an elongated slot, and wherein first and second rivets are mounted through the elongated slots and to the bottom surface of said platform for slidably mounting said plate thereto.

8. An induction watthour meter as claimed in claim 1 wherein said platform includes an integral rib extending along the side thereof opposite the two mounting tabs.

* * * * *